United States Patent

Shiomi et al.

Patent Number: 5,387,310
Date of Patent: Feb. 7, 1995

[54] METHOD FOR PRODUCING SINGLE CRYSTAL DIAMOND FILM

[75] Inventors: Hiromu Shiomi; Naoji Fujimori, both of Itami, Japan

[73] Assignee: Sumitomo Electric Industries, Ltd., Osaka, Japan

[21] Appl. No.: 47,384

[22] Filed: Apr. 16, 1993

Related U.S. Application Data

[63] Continuation of Ser. No. 489,517, Mar. 7, 1990, abandoned.

[30] Foreign Application Priority Data

Mar. 7, 1989 [JP] Japan ................... 1-54477

[51] Int. Cl.⁶ .............................................. C30B 29/04
[52] U.S. Cl. ................... 117/101; 423/446; 117/104; 117/929
[58] Field of Search ............... 156/610, 611, 612, 613, 156/614; 423/446

[56] References Cited

FOREIGN PATENT DOCUMENTS

| | | |
|---|---|---|
| 282054 | 9/1988 | European Pat. Off. . |
| 0282075 | 9/1988 | European Pat. Off. ............ 156/613 |
| 282075 | 9/1988 | European Pat. Off. . |
| 288065 | 10/1988 | European Pat. Off. . |
| 348026 | 12/1989 | European Pat. Off. . |
| 0195091 | 10/1985 | Japan .................. 423/446 |
| 61-286299 | 12/1986 | Japan . |
| 61-138395 | 6/1987 | Japan . |
| 2138395 | 6/1987 | Japan .................. 423/446 |
| 63-252997 | 10/1988 | Japan . |
| 1-1000093 | 4/1989 | Japan .................. 156/613 |

Primary Examiner—R. Bruce Breneman
Assistant Examiner—Felisa Garrett
Attorney, Agent, or Firm—Cushman, Darby & Cushman

[57] ABSTRACT

A single crystal diamond film having good electrical characteristics is produced by a method which comprises steps of decomposing a raw material gas comprising a hydrogen gas and a carbon-containing compound and epitaxially growing a single crystal diamond film on a single crystal substrate in a vapor phase, wherein a molar ratio of the carbon atoms in the carbon-containing compound to the hydrogen is from 2:100 to 10:100 and a lattice constant of the single crystal substrate satisfies the following relation:

$$|(a-a_0)/a| \times 100 \leq 20 \qquad (I)$$

where in $a_0$ is the lattice constant of diamond (3.567 Å) and $a$ is a lattice constant of the single crystal substrate.

4 Claims, 1 Drawing Sheet

Figure
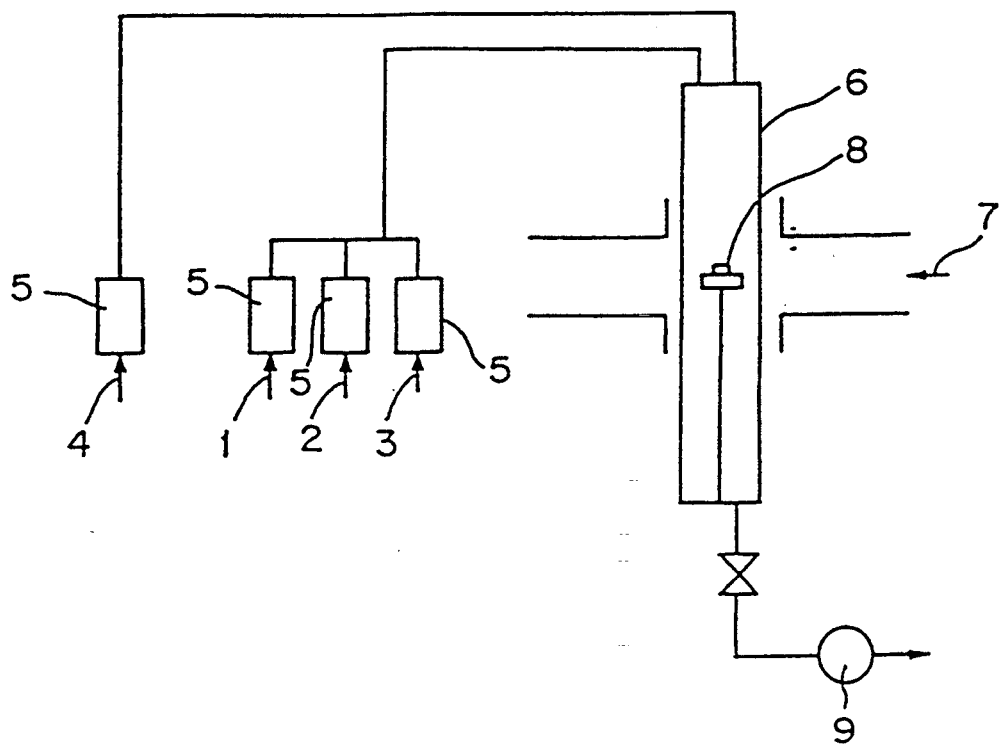

METHOD FOR PRODUCING SINGLE CRYSTAL DIAMOND FILM

This is a continuation of application Ser. No. 07/489,517 now abandoned, filed on Mar. 7, 1990, which was abandoned upon the filing hereof.

BACKGROUND OF THE INVENTION

1. Field of the Invention

The present invention relates to a method for producing a single crystal diamond film. In particular, the present invention relates to a method for producing a single crystal diamond film having good crystallinity, a smooth surface, and good electrical and optical characteristics.

2. Description of the Related Art

Diamond has a large forbidden band width, a large electron mobility, a large hole mobility, a large saturation electron mobility, a large thermal conductivity, a low dielectric constant and high clarity. Therefore, the diamond is highly expected as a material for semiconductors, for example, semiconductive elements having heat resistance and radiation resistance and high speed high output semiconductive elements, and as an element for emitting blue light or UV light.

Recently, R. Mania et al proposed a method for synthesizing diamond in a vapor phase which comprises decomposing and exciting a raw material comprising a hydrocarbon gas such as methane with radiofrequency discharge (R. Mania et al, Crystal Research and Technology, 16, 785 (1981)).

For example, when methane and hydrogen gas are supplied as raw materials under such condition that the methane concentration is 1% or less, a good quality single diamond film containing no graphite component can be grown on a silicon substrate. However, in case where the single diamond film is epitaxially grown on a single crystal diamond substrate, when the thickness of the single diamond film exceeds 1 $\mu$m, the film is cracked or abnormally grows (Kagakugijutsu-cho, Muki-zairyo Kenkyusho Kenkyuu Houkokusho, Vol. 39, 39 (1984)).

SUMMARY OF THE INVENTION

An object of the present invention is to provide a method for producing a single crystal diamond film having a smooth surface, good crystallinity, and improved electrical characteristics.

Accordingly, the present invention provides a method for producing a single crystal diamond film, which comprises steps of decomposing a raw material gas comprising a hydrogen gas and a carbon-containing compound and epitaxially growing a single crystal diamond film on a single crystal substrate in a vapor phase, wherein a molar ratio of the carbon atoms in the carbon-containing compound to the hydrogen is from 2:100 to 10:100 and a lattice constant of the single crystal substrate satisfies the following relation:

$$|(a-a_0)/a| \times 100 \leq 20 \quad (I)$$

wherein $a_0$ is the lattice constant of diamond (3.567 Å) and $a$ is a lattice constant of the single crystal substrate.

BRIEF DESCRIPTION OF THE DRAWING

FIGURE schematically shows a preferred embodiment of an apparatus for carrying out the method of the present invention.

DETAILED DESCRIPTION OF THE DRAWING

The raw material to be used according to the present invention comprises a hydrogen gas, a carbon-containing compound and optionally an oxygen-containing compound and a dopant. The raw material is supplied to a reaction chamber in a vapor phase. The raw material is preferably diluted with an inert gas.

Specific examples of the carbon-containing compound are paraffinic hydrocarbons (e.g. methane, ethane, propane, butane, etc.), olefinic hydrocarbons (e.g. ethylene, propylene, butylene, etc.), acetylene type hydrocarbons (e.g. acetylene, allylene, etc.), dienes (e.g. butadiene, etc.), alicyclic hydrocarbons (e.g. cyclopropane, cyclobutane, cyclopentane, cyclohexane, etc.), aromatic hydrocarbons (e.g. cyclobutadiene, benzene, toluene, xylene, naphthalene, etc.), ketones (e.g. acetone, diethyl ketone, benzophenone, etc.), alcohols (e.g. methanol, ethanol, etc.), amines (e.g. trimethylamine, triethylamine, etc.), carbon monoxide, carbon dioxide, and mixtures thereof. Further, the carbon-containing compound may be a compound consisting of carbon atoms such as graphite, coal and coke.

As the oxygen-containing compound, oxygen, water, carbon monoxide, carbon dioxide and hydrogen peroxide are preferable since they are easily available.

The inert gas includes argon, helium, neon, krypton, xenon and radon.

As the dopant, elemental boron, lithium, nitrogen, phosphorus, sulfur, chlorine, arsenic or selenium and their compounds can be used.

In the present invention, the molar ratio of the carbon-containing compound to the hydrogen gas is larger than in the conventional method. The molar ratio of the carbon atoms in the carbon containing compound to the hydrogen is from 2:100 to 10:100, preferably from 5:100 to 7:100. When this ratio is less than 2:100, a polycrystal film tends to grow. When this ratio is larger than 10:100, the graphite component tends to deposit.

As the substrate, not only the single crystal diamond but also a single crystal substrate a lattice constant (a) of which satisfies the following relation is used:

$$|(a-a_0)/a| \times 100 \leq 20, \text{ preferably } 10$$

in which $a_0$ is the lattice constant of the single crystal diamond (=3.567 Å) and a is a lattice constant of the substrate. Examples of the single crystal substrate are single crystal diamond, Ni (a: 3.524 Å), Cu (a: 3.6147 Å), Ni/Cu alloy, MgO (a: 4.213 Å), $\beta$-SiC (a: 4.36 Å), $\alpha$-SiC (a: 3.0807 Å), AlN (a: 3.104 Å), PbTiO$_3$ (a: 3.90 Å), Ba$_2$TiO$_4$ (a: 3.994 Å), GaN (a: 3.180 Å), ZnO (a: 3.2407 Å), ZnS (a: 3.820 Å), ZrO$_2$ (a: 3.64 Å), oxide superconductive materials such as Tl$_2$Ba$_2$Ca$_2$Cu$_3$O$_{10}$ (a: 3.85 Å) or Y$_1$Ba$_2$Cu$_3$O$_{7-x}$ (a: 3.89 Å), C-BN (3.615 Å) and the like.

When a substrate having a lattice constant which greatly differs from that of the diamond such as a silicon substrate, a polycrystal diamond grows on the substrate. Since the polycrystal diamond has many grain boundaries, deposition of graphite cannot be avoided when the carbon-containing compound is under supersaturated condition in the reaction vessel. Because of this, in the conventional method, the amount of the carbon-containing compound is reduced and the diamond is grown while etching graphite with a large amount of the hydrogen gas or the oxygen-containing compound. When the single crystal diamond or the single crystal material having the lattice constant close to that of the single crystal diamond is used as the substrate, nucleation of the diamond is easily achieved, so that the high quality single crystal diamond film can be epitaxially grown with supplying a large amount of the carbon-containing compound in a state in which a degree of supersaturation of the carbon-containing compound in the vapor phase is large and which is close to the thermodynamic equilibrium.

The vapor deposition of diamond can be carried out by a conventional method such as microwave plasma CVD (chemical vapor deposition), thermal filament CVD, RF plasma CVD, DC plasma CVD, plasma jet, chemical transportation, and the like. Among them, the plasma CVD using alternating current of 1 KHz or larger, particularly microwave plasma CVD is preferred, since the deposited diamond is less contaminated with impurities from a reaction chamber.

The pressure in the reaction chamber is usually from $10^{-4}$ to $10^3$ Torr.

The temperature of the substrate depends on the kind of substrate. Preferably, it is from 700° to 1000° C.

The method of the present invention will be illustrated by making reference to the accompanying drawing.

FIGURE schematically shows a preferred embodiment of an apparatus for carrying out the method of the present invention. Hydrogen gas 1, methane gas 2 as the carbon-containing compound and diborane gas 3 are metered with respective mass flow meters 5, mixed and then supplied in a reaction chamber 6. An inert gas 4 is metered with a mass flow meter 5 and then supplied in the reaction chamber 6. The gas mixture is decomposed in the chamber 6 with microwave 7. Carbon atoms generated through decomposition of methane is heated to several hundred degree (°C.) and reaches a single crystal substrate 8 to form a diamond layer and a graphite layer. The graphite layer is removed through reaction of carbon with hydrogen atoms generated by the decomposition of hydrogen. The reaction chamber 6 is evacuated with a vacuum pump 9.

PREFERRED EMBODIMENTS OF THE INVENTION

The present invention will be explained further in detail by following examples.

Examples 1–9 Comparative Examples 1 and 2

A single crystal diamond film was grown by using the apparatus of FIG. 1. As a substrate, a diamond single crystal of 2 mm in length, 1.5 mm in width and 0.3 mm in thickness was used with the (100) plane forming a deposition surface. As the raw material, methane, hydrogen and diborane (in Example 5 only) or argon (in Example 6 only) were supplied at flow rates of Table 1 for 2 hours under pressure of 40 Torr. at a substrate temperature of 830° C. (in Examples 1–5 and 7–9 and Comparative Examples 1 and 2) or 850° C. (in Example 6). The microwave having a frequency of 2.45 GHz and power of 300 W was used. The deposited diamond film had a thickness of about 1 μm. The diamond film was analyzed with electron-ray diffraction, a scanning type electron microscope and Raman spectroscopic analysis. The results are shown in Table 1.

TABLE 1

| Example No. | Single crystal substrate | Lattice constant (Å) | Supplied gases (flow rate, sccm) | | | | B/A (%) | Analysis |
|---|---|---|---|---|---|---|---|---|
| | | | $H_2$ (A) | $CH_4$ (B) | Inert gas | Dopant | | |
| C. 1 | Diamond (100) | 3.567 | 100 | 1 | 0 | 0 | 1 | Polycrystal diamond |
| 1 | ↑ | ↑ | ↑ | 2 | 0 | 0 | 2 | Single crystal diamond |
| 2 | ↑ | ↑ | ↑ | 4 | 0 | 0 | 4 | Partly grained |
| 3 | ↑ | ↑ | ↑ | 5 | 0 | 0 | 5 | Single crystal diamond with |
| 4 | ↑ | ↑ | ↑ | 6 | 0 | 0 | 6 | completely smooth surface |
| 5 | ↑ | ↑ | ↑ | 6 | 0 | $B_2H_6$ 20 ppm | 6 | |
| 6 | ↑ | ↑ | ↑ | 6 | Ar 20 | 0 | 6 | |
| 7 | ↑ | ↑ | ↑ | 7 | 0 | 0 | 7 | |
| 8 | ↑ | ↑ | ↑ | 8 | 0 | 0 | 8 | Single crystal diamond |
| 9 | ↑ | ↑ | ↑ | 10 | 0 | 0 | 10 | Partly amorphous |
| C. 2 | ↑ | ↑ | ↑ | 12 | 0 | 0 | 12 | Amorphous |

When the percentage of the mole number (B) of the carbon atoms in the carbon-containing compound per mole number (A) of the hydrogen is from 2 to 10%, the single crystal diamond was confirmed with the electron-ray diffraction. When B/A is from 2 to 7%, in the Raman spectroscopic analysis of the diamond films, no broad peak appeared around 1500 cm$^{-1}$ which indicates presence of amorphous diamond. This means that the diamond film was single crystal. When B/A is from 5 to 7%, the single crystal diamond films had completely smooth surfaces.

When the diamond was grown on the silicon substrate having the lattice constant of 5.43 Å under the same conditions, the amorphous carbon was partly contained in the diamond film.

The surface morphology of the deposited film largely depends on the plane orientation, and the smoothness of the deposited film was in the following order:

(100) > (111) > (110).

As understood from the results of Example 5, when $B_2H_6$ was used as a dopant, the deposited diamond film had a property of a p-type semiconductor, which had a hole mobility of 1000 cm$^2$/V.sec. Such high hole mobility cannot be achieved by the diamond film deposited under the conventional condition, namely B/A being less than 2%.

The results of Example 6 indicate that the inert gas stabilizes the plasma.

Examples 10-17 and Comparative Examples 3 and 4

In the same manner as in Example 1 but supplying the hydrogen gas and methane at flow rates of 100 sccm and 6 sccm, respectively and carrying out the deposition reaction at a substrate temperature of 830° C. under pressure of 40 Torr. for 2 hours with a microwave power of 300 W, a single crystal diamond film was deposited on the (100) plane of the diamond substrate. The thickness of the deposited diamond film was 2 μm. Kinds of the substrate used in these Examples are shown in Table 2. The results are also shown in Table 2.

TABLE 2

| Example No. | Single crystal substrate | Lattice constant (Å) | Supplied gases (flow rate, sccm) | | | B/A (%) | $|(a - a_0)/a|$ (%) | Analysis |
|---|---|---|---|---|---|---|---|---|
| | | | $H_2$ (A) | $CH_4$ (B) | Inert gas | | | |
| C. 3 | α-Fe | 2.87 | 100 | 6 | 0 | 6 | 24 | Amorphous carbon |
| 10 | Ni | 3.524 | ↑ | ↑ | ↑ | ↑ | 1.2 | Single crystal diamond |
| 11 | Diamond | 3.567 | ↑ | ↑ | ↑ | ↑ | 0 | |
| 12 | Ni—Cu alloy (47:53) | 3.567 | ↑ | ↑ | ↑ | ↑ | 0 | |
| 13 | Cu | 3.6147 | ↑ | ↑ | ↑ | ↑ | 1.3 | |
| 14 | MgO | 4.213 | ↑ | ↑ | ↑ | ↑ | 15 | |
| 15 | MgO | 4.213 | ↑ | ↑ | Ar 30 | ↑ | 15 | |
| 16 | SiC | 4.36 | ↑ | ↑ | 0 | ↑ | 18 | |
| 17 | C—BN | 3.615 | ↑ | ↑ | ↑ | ↑ | 1.3 | |
| C. 4 | Si | 5.43 | ↑ | ↑ | ↑ | ↑ | 34 | Amorphous carbon and single crystal diamond |

When the lattice constant of the substrate satisfies the above equation (I), the good quality single crystal diamond film can be deposited.

What is claimed is:

1. A method for producing a single crystal diamond film, which comprises the steps of:

decomposing a raw material gas comprising a hydrogen gas and a carbon containing compound, and epitaxially growing a single crystal diamond film on a (100) plane of a single crystal diamond substrate in a vapor phase, wherein a molar ratio of the carbon atoms in the carbon-containing compound to the hydrogen is from 2:100 to 10:100.

2. A method for producing a single crystal diamond film, comprising the steps of:

decomposing a raw material gas comprising a hydrogen gas and a carbon-containing compound, and epitaxially growing a single crystal diamond film on a single crystal substrate in a vapor phase, wherein a molar ratio of the carbon atoms in the carbon containing compound to the hydrogen is from 2:100 to 10:100 and the single crystal substrate is selected from the group consisting of AlN, ZnS, $Tl_2Ba_2Ca_2Cu_3O_{10}$, $Y_1Ba_2Cu_3O_{7-x}$ and C-BN.

3. The method according to claim 2, wherein the molar ratio of the carbon atoms in the carbon-containing compound to the hydrogen is from 5:100 to 7:100.

4. The method according to claim 1, wherein the molar ratio of the carbon atoms in the carbon-containing compound to the hydrogen is from 5:100 to 7:100.

* * * * *